United States Patent
Umeda

(10) Patent No.: US 9,490,932 B2
(45) Date of Patent: Nov. 8, 2016

(54) BURST SIGNAL RECEIVING APPARATUS AND METHOD, PON OPTICAL LINE TERMINAL, AND PON SYSTEM

(71) Applicant: SUMITOMO ELECTRIC INDUSTRIES, LTD., Osaka-shi, Osaka (JP)

(72) Inventor: Daisuke Umeda, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 52 days.

(21) Appl. No.: 14/401,871

(22) PCT Filed: Feb. 5, 2013

(86) PCT No.: PCT/JP2013/052580
§ 371 (c)(1),
(2) Date: Nov. 18, 2014

(87) PCT Pub. No.: WO2013/183319
PCT Pub. Date: Dec. 12, 2013

(65) Prior Publication Data
US 2015/0163010 A1 Jun. 11, 2015

(30) Foreign Application Priority Data
Jun. 5, 2012 (JP) ................................. 2012-128311

(51) Int. Cl.
*H04J 14/08* (2006.01)
*H04B 10/272* (2013.01)
(Continued)

(52) U.S. Cl.
CPC ............. *H04J 14/08* (2013.01); *H03G 3/3084* (2013.01); *H04B 10/272* (2013.01); *H04B 10/693* (2013.01); *H04L 7/0029* (2013.01); *H04L 7/0075* (2013.01); *H04L 7/0087* (2013.01)

(58) Field of Classification Search
CPC .... H04J 14/08; H04L 7/0075; H04B 10/564; H04B 10/693
See application file for complete search history.

(56) References Cited

U.S. PATENT DOCUMENTS

| 8,155,535 | B2 | 4/2012 | Noda et al. |
| 8,248,165 | B2 | 8/2012 | Umeda |

(Continued)

FOREIGN PATENT DOCUMENTS

| JP | 2003-218651 A | 7/2003 |
| JP | 2009-177577 A | 8/2009 |

(Continued)

*Primary Examiner* — Dzung Tran
(74) *Attorney, Agent, or Firm* — Drinker Biddle & Reath LLP

(57) ABSTRACT

The present invention relates to a receiving apparatus 20 that receives burst signals, each including a synchronization section and a data section following the synchronization section, from a plurality of sources in a time division manner. The receiving apparatus 20 includes amplifying units 102 and 113 that amplify each burst signal; a detecting unit 116 that detects arrival of the burst signal from an output signal from the amplifying units 102 and 113; a comparing unit 104 that compares the output signal from the amplifying units 102 and 113 with a predetermined threshold value and outputs a binary signal; and a control unit 108 that sets the timings of changing a receive function during the synchronization section by adding delay times Dai and Dbi to a detection time point where the detecting unit 116 performs an output. The control unit 108 is configured to be able to change the delay times Dai and Dbi in a plurality of ways.

9 Claims, 5 Drawing Sheets

(51) Int. Cl.
*H04B 10/69* (2013.01)
*H03G 3/30* (2006.01)
*H04L 7/00* (2006.01)

(56) References Cited

U.S. PATENT DOCUMENTS

2008/0205906 A1* 8/2008 Murata .............. H04B 10/6931
398/208

2010/0272448 A1* 10/2010 Kubo ................... H03G 3/3084
398/202
2011/0170874 A1* 7/2011 Sakuramoto ......... H04B 10/564
398/140
2013/0343769 A1* 12/2013 Noda ................... H04B 10/693
398/202

FOREIGN PATENT DOCUMENTS

JP 2009-303159 A 12/2009
WO WO-2007/102189 A1 9/2007

* cited by examiner

BURST SIGNAL RECEIVING APPARATUS AND METHOD, PON OPTICAL LINE TERMINAL, AND PON SYSTEM

TECHNICAL FIELD

The present invention relates to a receiving apparatus and method for receiving, for example, burst signals which are intermittently transmitted to an optical line terminal from optical network units forming a PON (Passive Optical Network) system, and an optical line terminal and a PON system that use the receiving apparatus.

BACKGROUND ART

A PON system is a system in which an optical line terminal serving as a central station is connected to optical network units installed in a plurality of subscribers' homes by an optical fiber network where a single optical fiber is split into a plurality of optical fibers through an optical coupler.

In this case, if the plurality of optical network units simultaneously perform transmission to the optical line terminal, then transmitted data units collide with each other. Thus, the optical line terminal provides the optical network units with grants for a transmission timing and an amount of transmission data. Each optical network unit performs upstream transmission of the amount of transmission data allowed by the optical line terminal at the timing allowed by the optical line terminal.

Since the distances between the optical line terminal and the optical network units vary between the locations where the optical network units are installed, the strengths of upstream optical signals received by the optical line terminal are not uniform. Thus, upstream optical signals with various strengths intermittently arrive at the optical line terminal from the plurality of optical network units.

Hence, there is already proposed a technique in which, in order to improve the reception responsivity to an optical burst signal, the response speed of a receiving apparatus to a burst signal is changed between a synchronization section (preamble) and a data section (payload) (see Patent Literature 1).

In this conventional art, specifically, a small time constant is set for the synchronization section to increase the followability for a burst signal, and a large time constant is set for the data section to enhance the reception tolerance to consecutive identical digits.

In addition, there is already proposed a technique in which in order that a pre-amplifier suitable for an optical receiver module of an optical line terminal can stably amplify a broadband burst signal, the operating mode of the amplifier is made switchable to either a gain adjustment mode or a gain fixed mode (see Patent Literature 2).

In this conventional art, specifically, in the adjustment mode, an appropriate gain is determined from among two levels, based on the strength of a burst signal in a synchronization section, and after the determination, the burst signal is amplified in the fixed mode where the gain is fixed.

CITATION LIST

Patent Literature

Patent Literature 1: Japanese Unexamined Patent Publication No. 2009-177577

Patent Literature 2: Japanese Unexamined Patent Publication No. 2009-303159

SUMMARY OF INVENTION

Technical Problem

In the case of Patent Literature 1, if the switching timing of the time constant enters the data section, then a signal is received with a small time constant set for the beginning of the data section, weakening the reception tolerance to consecutive identical digits. Thus, the time constant needs to be switched during the synchronization section.

In addition, in the case of Patent Literature 2, if the switching timing of the operating mode of the pre-amplifier enters the data section, then the beginning of the data section is not amplified by an appropriate gain. Thus, the operating mode of the preamplifier needs to be switched during the synchronization section.

Regarding this point, the optical line terminal can grasp the arrival timing of an optical burst signal in the upstream direction from a registered optical network unit, based on a grant determined thereby. Thus, the optical line terminal can set the switching timings of the time constant and the operating mode of the pre-amplifier (which may be hereinafter collectively referred to as the "receive function") in accordance with the synchronization section.

On the other hand, during a discovery period which takes place when a new optical network unit is connected, the optical line terminal cannot grasp the reception timing of an optical burst signal from the new optical network unit, and thus, needs to determine the above-described switching timings with reference to a time point where a burst is detected thereby.

However, the manner in which a signal rises during a period of time (transmission ON time) from when an optical transmitter of an optical network unit starts to transmit an optical burst signal until the optical burst signal is turned on stably varies between the models or manufacturers of optical network units. Thus, the time point where a burst is detected by the optical line terminal may vary.

In this case, the switching timings of the receive function with reference to the time point where a burst is detected also vary. Thus, there is a problem that, when the receive function is switched at inappropriate timings, the burst signal cannot be appropriately received.

In view of the above-described conventional problems, an object of the present invention is to provide a receiving apparatus, etc., capable of appropriately receiving a burst signal having a synchronization section, followed by a data section.

Solution to Problem (1) A receiving apparatus of the present invention is a receiving apparatus that receives burst signals, each including a synchronization section and a data section following the synchronization section, from a plurality of sources in a time division manner, and includes: an amplifying unit that amplifies each of the burst signals; a detecting unit that detects arrival of the burst signal from an output signal from the amplifying unit; a comparing unit that compares the output signal from the amplifying unit with a predetermined threshold value and outputs a binary signal; and a control unit that sets a timing of changing a receive function during the synchronization section by adding a delay time to a detection time point where the detecting unit performs an output, and that can change the delay time in a plurality of ways.

According to the receiving apparatus of the present invention, the control unit sets a timing of changing the receive function during the synchronization section by adding a delay time to a detection time point where the detecting unit performs an output, and can change the delay time in a plurality of ways. Thus, by adjusting the timing of changing the receive function by trial and error using a plurality of delay times, switching of the receive function can be performed at an appropriate timing.

Hence, a burst signal having a synchronization section, followed by a data section can be appropriately received.

Note that, when the receiving apparatus of the present invention can identify a time point where a burst signal from a predetermined transmitting apparatus (e.g., an optical network unit in upstream communication in a PON system) is received (e.g., when the optical network unit performs upstream transmission in accordance with a transmission time granted by an optical line terminal in the PON system), the receiving apparatus does not need to perform the above-described process in which the timing of changing the receive function is adjusted by trial and error.

Therefore, the receiving apparatus of the present invention needs to perform the above-described process in which the timing of changing the receive function is adjusted by trial and error, only when the receiving side cannot identify a time point where a burst signal from a transmitting apparatus is received (e.g., when it is a discovery period of a PON system).

Namely, in the receiving apparatus of the present invention, the control unit that sets the timing of changing the receive function during the synchronization period by adding a delay time to a detection time point where the detecting unit performs an output needs to be able to change the delay time only when a time point where a burst signal from a transmitting apparatus is received cannot be identified.

In addition, in the receiving apparatus of the present invention, in the above-described process in which the timing of changing the receive function is adjusted by trial and error, there may be a case of failing to receive a burst signal. However, once reception has succeeded, the timing of changing the receive function of the burst signal can be identified thereafter. Thus, it is not particularly problematic.

(2) In the receiving apparatus of the present invention, it is preferred that, when clock and data recovery based on the binary signal cannot be performed despite a fact that the detecting unit has detected arrival of the burst signal, the control unit change the delay time to a different value.

By doing so, compared to the case in which the value of the delay time is changed in fixed or random order, the possibility that a burst signal can be appropriately received can be increased.

(3) However, the control unit may switch a value of the delay time to a different value in fixed or random order every time the detecting unit detects arrival of a burst signal.

By doing so, there is no need to determine whether clock and data recovery based on a binary signal has succeeded. Thus, there is an advantage in ease of control to change the delay time.

(4) It is preferred that the receiving apparatus of the present invention further include a time constant circuit that can follow the output signal from the amplifying unit at different time constants.

In this case, the time constant is included in the receive function to be changed during the synchronization section.

As the control unit, one may be adopted that can set a timing of changing the time constant during the synchronization section by adding the delay time to a time point where the detecting unit performs an output, and that can change the delay time in a plurality of ways.

(5) In addition, in the receiving apparatus of the present invention, it is preferred that the amplifying unit include an amplifier circuit having, as a switchable operating mode, an adjustment mode where a gain is adjusted according to a strength of the burst signal, and a fixed mode where the gain is fixed.

In this case, the operating mode is included in the receive function to be changed during the synchronization section.

As the control unit, one may be adopted that can set a timing of changing the operating mode during the synchronization section by adding the delay time to a time point where the detecting unit performs an output, and that can change the delay time in a plurality of ways.

(6) A receiving method of the present invention is a receiving method for a case of receiving burst signals, each including a synchronization section and a data section following the synchronization section, from a plurality of sources in a time division manner, and includes the steps of: detecting arrival of each of the burst signals from an amplified signal of the burst signal; comparing the amplified signal with a predetermined threshold value and outputting a binary signal; setting a first timing of changing a receive function during the synchronization section by adding a first delay time to a detection time point of the arrival; and setting a second timing of changing the receive function during the synchronization section by adding a second delay time to the detection time point, the second delay time being different than the first delay time.

The receiving method of the present invention includes the step of setting a timing of changing the receive function during the synchronization section by adding a first delay time to a detection time point where the detecting unit performs an output; and the step of setting a timing of changing the receive function during the synchronization section by adding a second delay time different than the first delay time to the detection time point. Thus, by performing those steps of adjusting the timing of changing the receive function by trial and error using the first and second delay times, switching of the receive function can be performed at an appropriate timing.

Hence, a burst signal having a synchronization section, followed by a data section can be appropriately received.

Note that, in the receiving method of the present invention, the first and second delay times are expressions focusing on two types of the delay time with different values. Thus, the number of values of the delay time used in the receiving method of the present invention is not limited to two.

Therefore, the receiving method of the present invention also includes a case in which the above-described two steps are repeated using the values of three types or more of the delay time and the timing of changing the receive function during the synchronization section is adjusted three times or more.

(7) An optical line terminal of the present invention is a PON optical line terminal including the receiving apparatus described in the above-described (1) to (5), and provides the same functions and effects as those provided by the receiving apparatus.

(8) In the optical line terminal of the present invention, it is preferred that the control unit re-set the timing for a discovery period for registering the optical network units.

The reason for that is that since, as described above, the optical line terminal cannot pre-detect the transmission timing of a burst signal from a new optical network unit during a discovery period, the optical line terminal needs to determine the timing of changing the receive function during a synchronization section, from a time point where a burst signal is detected thereby. Thus, the utility value for when the present invention is adopted is high.

(9) A PON system of the present invention is a PON system including, as a component, an optical line terminal having the receiving apparatus described in the above-described (1) to (5), and provides the same functions and effects as those provided by the receiving apparatus.

Advantageous Effects of Invention

As described above, according to the present invention, a burst signal including a synchronization section and a data section can be appropriately received.

DESCRIPTION OF EMBODIMENTS

An embodiment of the present invention will be described below based on the drawings.

[Overall Configuration of a PON System]

Figure 1:
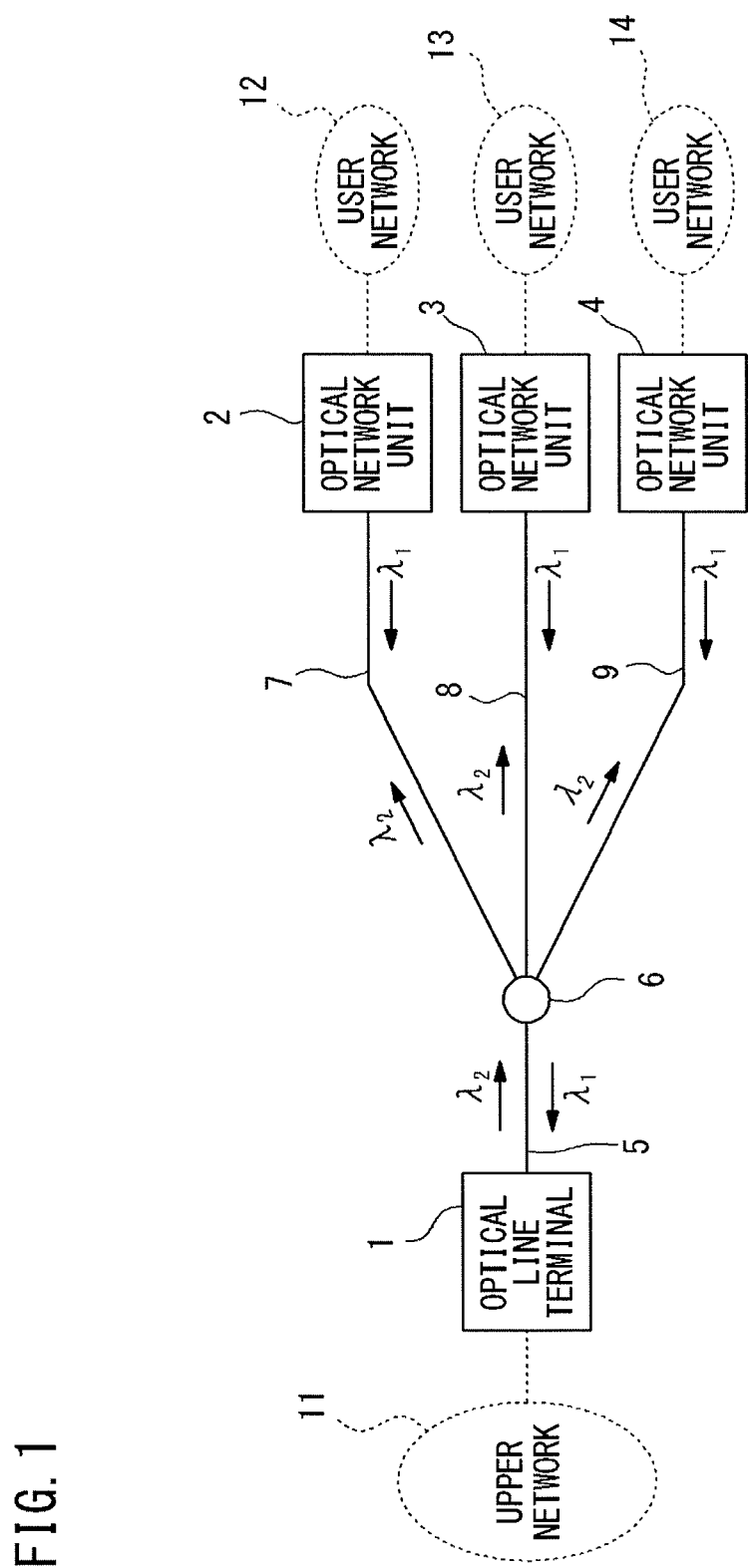
FIG. 1 is an overall configuration diagram of a PON system according to an embodiment of the present invention.

FIG. 1 is an overall configuration diagram of a PON system according to an embodiment of the present invention.

In FIG. 1, an optical line terminal (OLT) 1 is installed as a central station for a plurality of optical network units (ONUs) 2 to 4. The optical network units 2 to 4 are installed in PON system subscribers' homes, respectively.

A single optical fiber 5 connected to the optical line terminal 1 is split into a plurality of optical fibers (branch lines) 7 to 9 through an optical coupler 6 which is a passive optical splitting node. The optical network units 2 to 4 are connected to the ends of the split optical fibers 7 to 9, respectively.

The optical line terminal 1 is communicably connected to an upper network 11, and the optical network units 2 to 4 are communicably connected to their respective user networks 12 to 14.

Although FIG. 1 shows three optical network units 2 to 4, it is possible to connect, for example, 32 optical network units by splitting an optical fiber into 32 optical fibers through the single optical coupler 6. In addition, although in FIG. 1 only one optical coupler 6 is used, by providing a plurality of optical couplers 6 longitudinally, more optical network units can be connected to the optical line terminal 1.

Note that the distances from the optical line terminal 1 to the optical network units 2 to 4 are not uniform, and thus, the strengths of signals coming from the optical network units 2 to 4 are not uniform, either.

In FIG. 1, in the upstream direction from the optical network units 2 to 4 to the optical line terminal 1, data is transmitted at wavelength $\lambda 1$.

On the other hand, in the downstream direction from the optical line terminal 1 to the optical network units 2 to 4, data is transmitted at wavelength $\lambda 2$. The wavelengths $\lambda 1$ and $\lambda 2$ are set based on, for example, Clause 60 of IEEE Standard 802.3ah-2004 in the case of GE-PON.

In the above-described PON system, downstream transmission from the optical line terminal 1 to the optical network units 2 to 4 is performed at any time in broadcast form. Each of the optical network units 2 to 4 captures only those downstream frames destined therefor, and discards other downstream frames.

On the other hand, upstream transmission from the optical network units 2 to 4 to the optical line terminal 1 is performed under the control of the optical line terminal 1. Each of the optical network units 2 to 4 performs upstream transmission of an amount of transmission data allowed for transmission at a transmission time allowed (granted) for transmission by the optical line terminal 1.

[Burst Receiver Circuit of the Optical Line Terminal]

Figure 2:
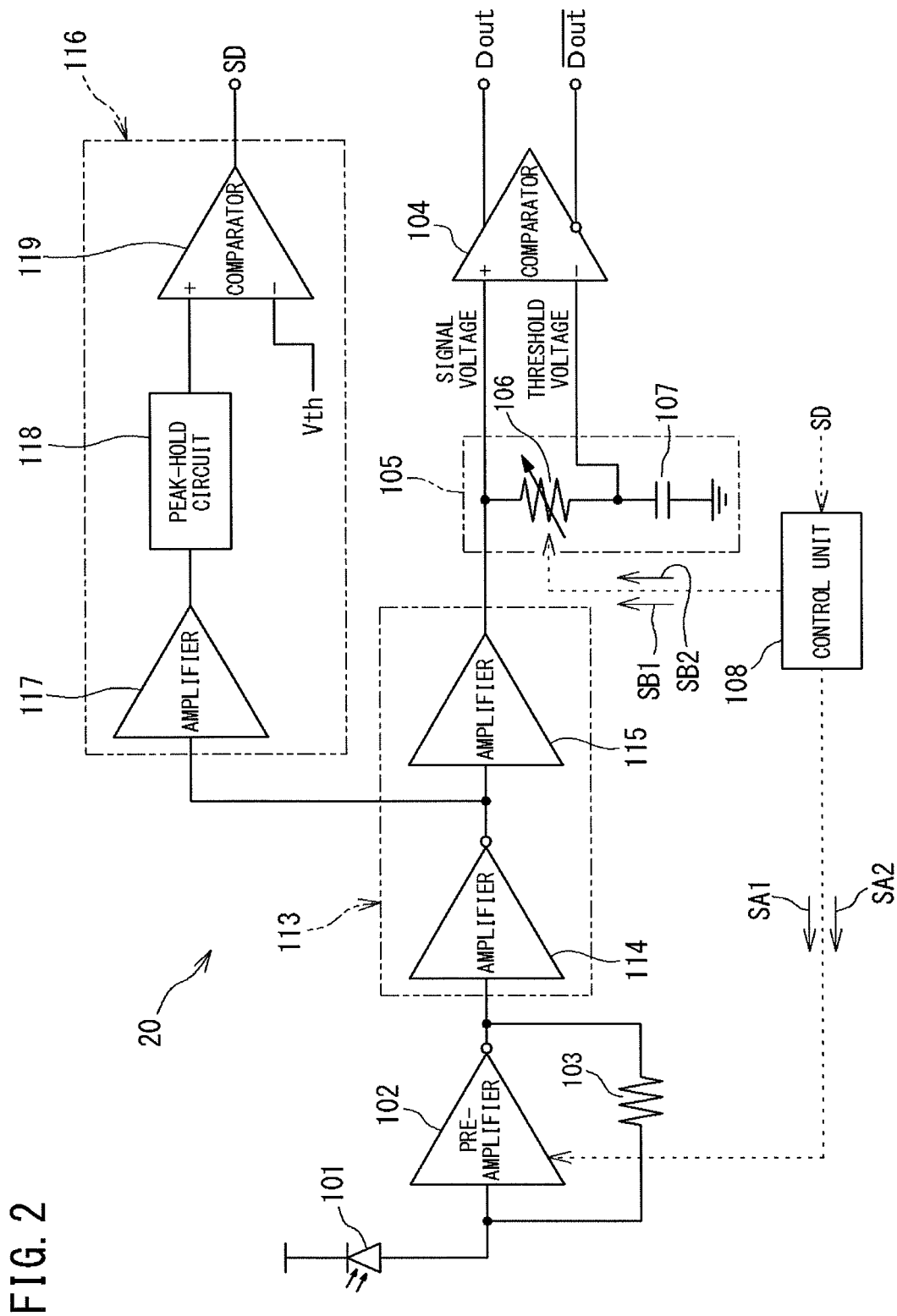
FIG. 2 is a circuit diagram of a receiver circuit provided in an optical line terminal.

FIG. 2 is a circuit diagram of a receiver circuit (receiving apparatus) 20 provided in the optical line terminal 1.

As shown in FIG. 2, the receiver circuit 20 of the present embodiment includes a photodiode 101, a pre-amplifier 102, a feedback resistor 103, a post-amplifier 113, a time constant circuit 105, a comparator 104, and a signal detector circuit 116.

Of the components, the photodiode 101 which is a light receiving element receives an optical burst signal generated based on a binary signal (digital signal), and converts the optical burst signal into an electrical signal and outputs the electrical signal.

The output signal from the photodiode 101 is amplified by the pre-amplifier 102 having the feedback resistor 103 connected between its input and output. The amplified signal (the burst signal formed of the electrical signal) outputted from the pre-amplifier 102 is inputted to the post-amplifier 113 subsequent to the pre-amplifier 102.

The post-amplifier 113 includes two amplifiers 114 and 115. The amplifiers 114 and 115 further amplify the amplitude of the burst signal outputted from the pre-amplifier 102. The pre-amplifier 102 and the post-amplifier 113 compose an amplifying unit that amplifies the burst signal formed of the electrical signal outputted from the photodiode 101.

An output signal from the post-amplifier 113 is inputted as a signal voltage to one of the input terminals of the comparator 104. In addition, a voltage which is the burst signal outputted through the time constant circuit 105 is inputted as a threshold voltage to the other input terminal of the comparator 104.

The time constant circuit 105 is formed of a low-pass filter including a variable resistor 106 whose resistance value is variable by external control; and a capacitor 107 whose one end is connected to the resistor 106 and whose other end is the ground potential. In this case, when the resistance value of the variable resistor 106 is R and the capacitance of the capacitor 107 is C, the time constant $\tau$ can be calculated by $\tau = R \cdot C$.

The comparator 104 compares the signal voltage with the threshold voltage and outputs the comparison result as a binary signal (digital signal) Dout of 0 or 1 and a logically inverted signal thereof. The resistance value of the resistor 106 can be changed by a control unit 108.

The signal detector circuit 116 composes a detecting unit that detects arrival of the burst signal from an output signal from the post-amplifier 113. The signal detector circuit 116 includes an amplifier 117, a peak-hold circuit 118, and a comparator 119.

The input terminal of the amplifier 117 is connected between the amplifiers 114 and 115 in the post-amplifier 113. An output signal from the amplifier 114 is inputted to the peak-hold circuit 118. The peak-hold circuit 118 holds a maximum voltage value of the amplifier 117 and outputs the maximum voltage value to the comparator 119 subsequent thereto.

The comparator 119 compares the held voltage value with a predetermined threshold value (reference voltage) Vth. When the voltage value is greater than or equal to the threshold value Vth, the comparator 119 sets a burst detection signal SD to "High". When the voltage value is less than the threshold value Vth, the comparator 119 sets the burst detection signal SD to "Low".

The pre-amplifier 102 can operate in either an "adjustment mode" which is an operating mode where the gain is adjusted according to the strength of the burst signal (electrical output) inputted thereto from the photodiode 101 or a "fixed mode" which is an operating mode where the gain is fixed.

As such a pre-amplifier 102 capable of switching the operating mode, there is, for example, one shown in the above-described Patent Literature 2. In the present embodiment, the same pre-amplifier as that one is adopted. Note that the operating mode of the pre-amplifier 102 may have a third mode other than those described above.

For the already registered optical network units 2 to 4, the control unit 108 performs predetermined dynamic bandwidth allocation in response to a request, and generates grants each including the transmission timing and amount of transmission data of an optical burst signal to be transmitted by each of the optical network units 2 to 4, and performs downstream transmission of the grants to the optical network units 2 to 4.

The control unit 108 grasps the arrival times and time lengths of synchronization sections and data sections of the optical burst signals to be transmitted by the optical network units 2 to 4, based on the transmission timings granted thereby to the optical network units 2 to 4.

The control unit 108 performs downstream transmission of a discovery gate during a "discovery period" (see FIG. 4) for registering an unregistered optical network unit (not shown). The control unit 108 provides an LLID to an optical network unit having performed upstream transmission of a registration request in response to the discovery gate, and thereby newly registers the optical network unit.

In addition, the control unit 108 controls the switching timing of the operating mode of the pre-amplifier 102 by control signals SA1 and SA2, and controls the switching timing of the time constant of the time constant circuit 105 by control signals SB1 and SB2 (see FIG. 2).

Of the control signals SA1, SA2, SB1, and SB2, the control signals SA1 and SB1 are control signals for the registered optical network units 2 to 4, and the control signals SA2 and SB2 are control signals for unregistered optical network units.

Namely, the control unit 108 controls the switching of the pre-amplifier 102 and the time constant circuit 105 by the control signals SA1 and SB1 during a normal period other than the discovery period, and controls the switching of the pre-amplifier 102 and the time constant circuit 105 by the control signals SA2 and SB2 during the discovery period.

[Switching Control of the Receive Function During the Normal Period]

Figure 3:
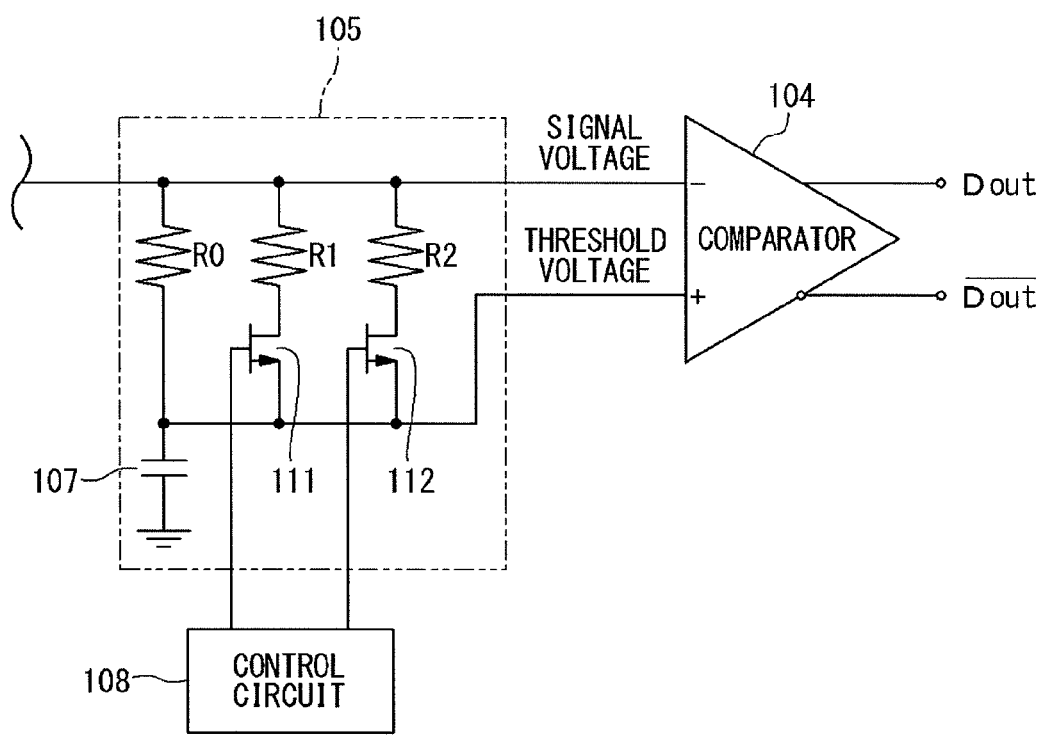
FIG. 3 is a circuit diagram showing the details of a time constant circuit.
Figure 4:
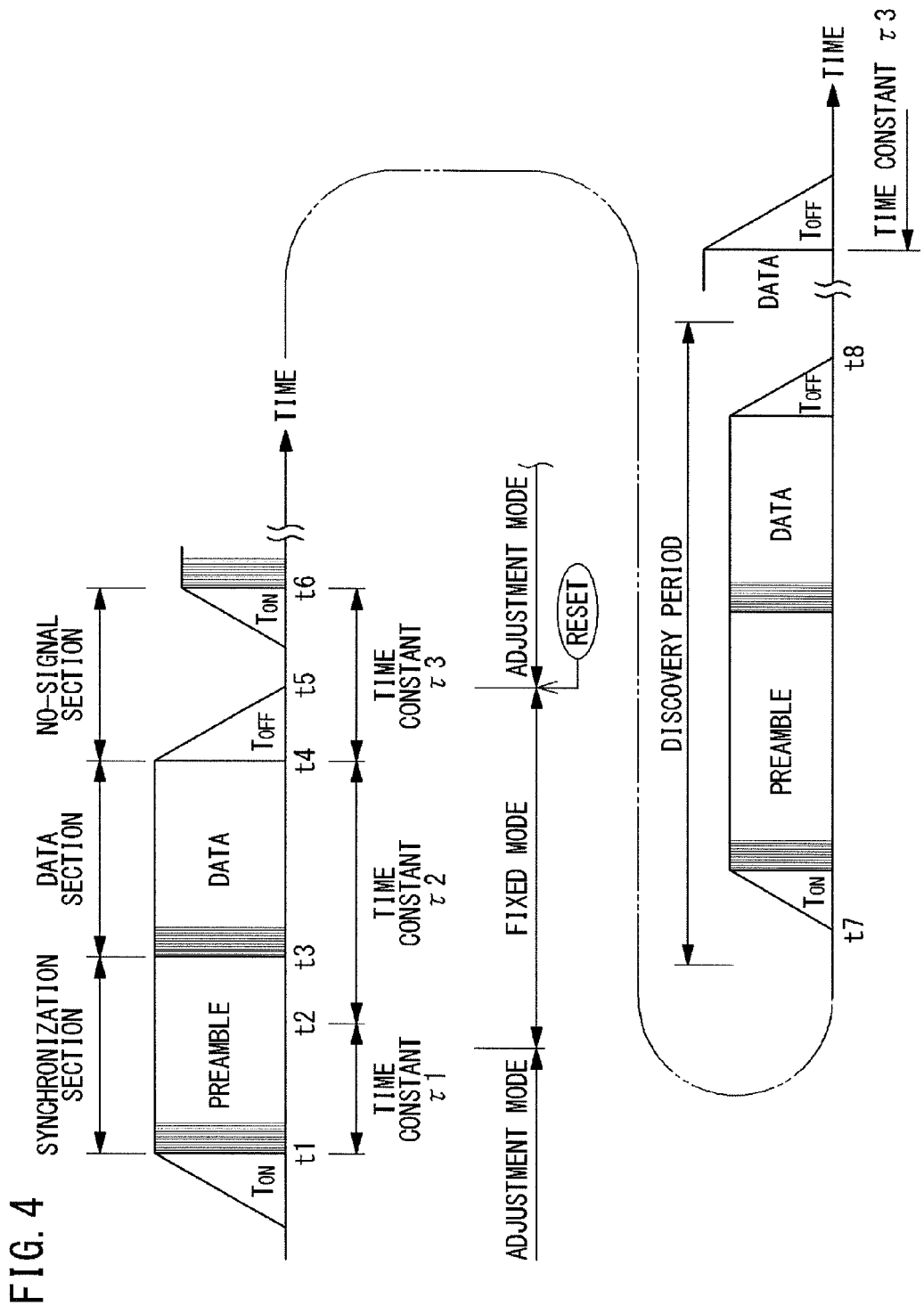
FIG. 4 is an illustrative diagram showing an example of burst signal arrival order.

FIG. 3 is a circuit diagram showing a specific example of the time constant circuit 105 for making the resistance value of the resistor 106 variable. FIG. 4 is an illustrative diagram showing an example of burst signal arrival order.

As shown in FIG. 3, the time constant circuit 105 includes a series unit of a resistor R0 (resistance value R0) and the capacitor 107 which is provided between a signal potential and the ground potential.

In addition, the time constant circuit 105 includes a series unit of a resistor R1 (resistance value R1) connected in parallel to the resistor R0 and a switching element (e.g., a MOS-FET) 111; and likewise a series unit of a resistor R2 (resistance value R2) connected in parallel to the resistor R0 and a switching element 112.

Here, in EPON (IEEE 802.3ah) and 10G-EPON (IEEE 802.3av), a burst signal is composed of the following portions 1) to 4) in this order from the beginning (see FIG. 4).

1) Transmission ON section ($T_{ON}$): a time period for a transmitter of an ONU to stably turn on a burst signal. Note, however, that a signal waveform is not guaranteed during this section.

2) Synchronization section: a time period for a receiver of the OLT to synchronize to the burst signal. It is also called a preamble section.

3) Data section: a time period during which data is transmitted. It is also called a payload section.

4) Transmission OFF section ($T_{OFF}$): a time period for the transmitter of the ONU to turn off the burst signal.

With reference to FIG. 4, during the normal period, the control unit 108 grasps in advance time t1 at which the preamble portion starts to be received first; time t3 at which the data portion starts to be received first; time t4 at which the reception of the burst signal is completed; and time t5 at which the burst signal is turned off. In addition, the control unit 108 also grasps in advance time t6 at which the next burst signal starts to arrive after a no-signal section.

Hence, during the normal period, the control unit 108 switches the time constant of the time constant circuit 105 by turning on/off the control terminals of the switching elements 111 and 112 (e.g., the gates of MOS-FETs) in the time constant circuit 105 by the control signal SA1 as shown in the following table 1.

TABLE 1

| Control example 1 (R2 < R1) | | Switching element 111 | Switching element 112 | Time constant |
|---|---|---|---|---|
| First part of the signal | Preamble section (first half) | On | Off | τ1 (medium) |
| Last part of the signal | Preamble section (second half) and data section | Off | Off | τ2 (long) |
| No-signal section | | Off | On | τ3 (short) |

In table 1, it is assumed that the resistance values R1 and R2 have a relationship of R2<R1. Different controls are performed on on/off of the switching elements 111 and 112 for the first part and last part of the burst signal and the no-signal section of the burst signal.

First, during a part of the synchronization section which is the first part of the signal (time t1 to t2), the switching element 111 is placed in an on state, and the switching element 112 is placed in an off state.

By this, when the on-resistance of the switching element 111 is Rs1, the time constant circuit 105 is formed such that the capacitor 107 (capacitance C) is connected to parallel resistors of the resistor R0 and the resistors (R1+Rs1). In this case, the time constant τ1 is as shown in the following equation (1):

$$\tau1=\{R0\cdot(R1+Rs1)/(R0+R1+Rs1)\}\cdot C \quad (1)$$

Note that time t2 can be set to a predetermined time a bit before time t3 which is the end of the preamble.

Subsequently, during the other part of the synchronization section (time t2 to t3) and the data section (time t3 to t4) which are the last part of the signal, i.e., time t2 to t4, the switching elements 111 and 112 are both placed in an off state. By this, the resistors R1 and R2 in the time constant circuit 105 become invalid, resulting in a time constant of only the resistor R0 and the capacitor 107 (capacitance C). This time constant τ2 is as shown in the following equation (2):

$$\tau2=R0\cdot C \quad (2)$$

Subsequently, during the no-signal section (time t4 to t6), the switching element 111 is placed in an off state and the switching element 112 is placed in an on state. By this, when the on-resistance of the switching element 112 is Rs2, the time constant is of the resistor R0, parallel resistors of R2+Rs2, and the capacitor 107 (capacitance C). This time constant τ3 is as shown in the following equation (3):

$$\tau3=\{R0\cdot(R2+Rs2)/(R0+R2+Rs2)\}\cdot C \quad (3)$$

In the above-described equations (1) to (3), when another resistor (R1 or R2) is connected in parallel to the resistor R0, the resistance value of the entire parallel resistors is smaller than the resistor R0. In addition, the smaller the resistance value connected in parallel, the smaller the resistance value of the entire parallel resistors. Therefore, the following inequality (4) holds:

$$\tau3<\tau1<\tau2 \quad (4)$$

When this is represented as a relative relationship between the lengths of the time constant, the first part of the signal is "medium", the last part of the signal is "long", and the no-signal section is "short".

The control unit 108 switches the time constant of the time constant circuit 105 in the above-described manner, and sets the time constant for the first half of the synchronization section (t1 to t2) to be relatively short. By this, the threshold voltage which is the output voltage from the time constant circuit 105 promptly follows the median of the preamble.

In particular, when a bit-inversion repeating signal such as 0, 1, 0, 1, . . . is used in the preamble, since the frequency component of the signal is high (there is only one bit of a consecutive identical symbol), by setting a short time constant, the median can be rapidly detected. By this, the responsivity to the burst signal is improved.

During a period from the second half of the synchronization section to the data section which is the last part of the signal (t2 to t4), the control unit 108 sets the time constant to be longer than that for the first part of the signal, according to the encoding format in the data section. By this, the threshold voltage in the data section is stabilized so as not to shift much from the center of the amplitude.

Furthermore, the control unit 108 sets the time constant to be shortest in the no-signal section to promptly bring the threshold voltage back to a no-signal level. Therefore, even immediately after receiving a burst signal with high optical signal strength (amplitude), the threshold voltage can be promptly brought back to a no-signal level and thus a no-signal period can be reduced. Hence, the upstream communication bandwidth can be more effectively utilized.

During the normal period, the control unit 108 switches the operating mode of the pre-amplifier 102 by the control signal SB1 at the timings shown in FIG. 4.

Specifically, until the time point a bit before time t2, the control unit 108 sets the operating mode of the pre-amplifier 102 to an "adjustment mode" to allow the pre-amplifier 102 to adjust the gain according to the strength of the burst signal.

During a period after the above-described time point where the signal strength is stabilized, the control unit 108 sets the operating mode of the pre-amplifier 102 to a "fixed mode" to fix the gain of the pre-amplifier 102 at a predetermined value.

Note that at time t5 at which the burst signal is turned off, the control unit 108 changes the fixed mode back to an "adjustment mode", and resets the value of the output voltage held by the pre-amplifier 102 to bring the gain back to its initial value. By this, it becomes easier to adjust the gain for the next burst signal.

[Switching Control of the Receive Function During the Discovery Period]

Figure 5:
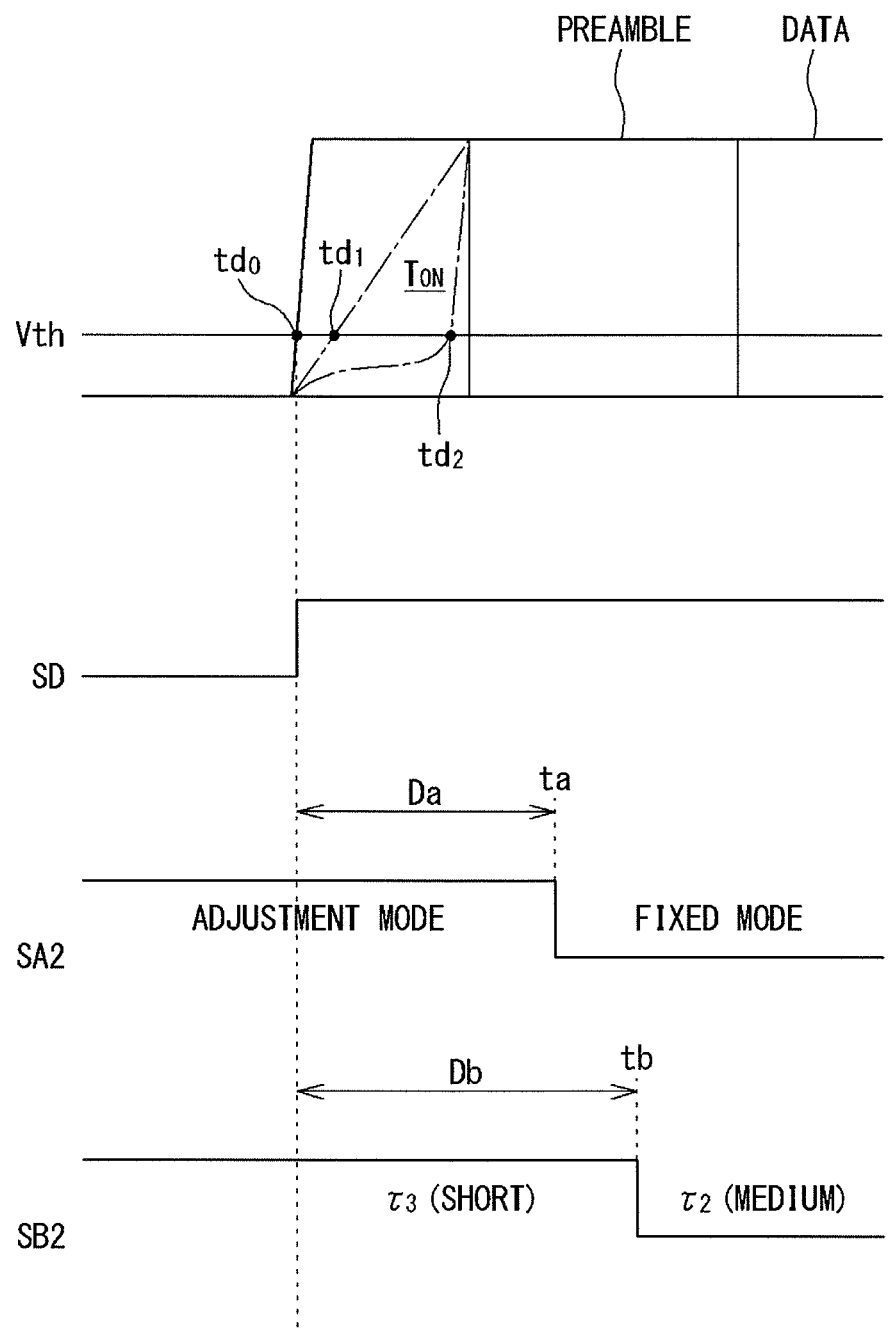
FIG. 5 is a time chart showing a temporal relationship between the first half portion of a burst signal, a burst detection signal, and the switching timings of a pre-amplifier and the time constant circuit.

FIG. 5 is a time chart showing a temporal relationship between the first half portion of a burst signal, a burst detection signal SD, and control signals SA2 and SB2 for the pre-amplifier 102 and the time constant circuit 105.

As described above, the optical line terminal 1 waits for upstream transmission from an unregistered optical network unit during the discovery period (see FIG. 4). For an optical burst signal received during the discovery period (an optical burst signal at time t7 to t8 in FIG. 4), the optical line terminal 1 cannot perform switching control of the pre-amplifier 102 and the time constant circuit 105 using time t1 to t6 grasped in advance thereby.

Hence, as shown in FIG. 5, the control unit 108 determines the switching timings of the operating mode and the time constant with reference to the burst detection signal SD outputted from the signal detector circuit 116, and uses the determined timings as a trigger to change the states of the control signals SA2 and SB2.

Specifically, the control unit 108 pre-stores delay times Da and Db from a burst detection time point td0. The control unit 108 uses time ta obtained by adding the delay time Da to the burst detection time point td0 as the switching timing of the operating mode, and uses time tb obtained by adding the delay time Db to the burst detection time point td0 as the switching timing of the time constant.

Namely, the control signal SA2 which is outputted to the pre-amplifier 102 from the control unit 108 during the discovery period is a control signal that sets the operating mode to an adjustment mode until time ta which is obtained by adding the delay time Da to an SD rise time point td0, and sets the operating mode of the pre-amplifier 102 to a fixed mode after that time ta.

In addition, the control signal SB2 which is outputted to the time constant circuit 105 from the control unit 108 during the discovery period is a control signal that sets the time constant of the time constant circuit 105 to shortish "τ3" until time tb which is obtained by adding the delay time Db to the SD rise time point td0, and sets the time constant of the time constant circuit 105 to longer "τ2" after that time tb.

Note that, as shown in FIG. 5, the delay times Da and Db are set such that both of time ta and tb are within the synchronization section and ta<tb. By this, after the amplitude of an output signal from the pre-amplifier 102 is stabilized, the time constant can be switched.

Meanwhile, if, as indicated by a solid line at the top of FIG. 5, the manner in which the beginning of the burst signal rises (the form of a transmission ON section) is sufficiently fast and has a form close to an ideal rectangular wave, then even if the source of the burst signal is changed or even if the reception strength of the burst signal is changed, the burst detection time point td0 does not move forward or backward.

However, the manner in which the beginning of the burst signal rises varies between the models or manufacturers of optical network units. For example, as indicated by imaginary lines at the top of FIG. 5, the burst signal may exceed the threshold value Vth at time td1 which is substantially the center of the transmission ON section, or may exceed the threshold value Vth at time td2 immediately before the start of the synchronization section. In addition, as indicated by the solid line, the burst signal may exceed the threshold value Vth at time td0 which is the front edge of the transmission ON section.

Therefore, in practice, the rise of the burst detection signal SD often varies forward or backward in the range of time td0 to td2. In this case, time to and tb calculated based on the SD also vary forward or backward.

In particular, when the rise of the burst detection signal SD is delayed later than time td2, time ta and tb are also correspondingly delayed significantly. At worst, both of time ta and tb enter the data section and accordingly the burst signal may not be able to be appropriately received.

In view of this, in the present embodiment, a plurality of switching timings are prepared in advance, and the switching timings are changed in fixed order or randomly every discovery period for registering an optical network unit. By this, the above-described problem is solved.

Specifically, the control unit 108 holds delay times Dai and Dbi of at least two types, long and short (i=1, 2, . . . ).

The control unit 108 changes each of the held delay times Dai and Dbi to a different value every discovery period, and thereby sets each of the switching timings of the control signals SA2 and SB2 to a different time point for each discovery period.

For example, when the switching timings of the control signals SA2 and SB2 are changed in fixed order, the control unit 108 uses delay times Da1 and Db1 during a predetermined discovery period, and uses delay times Da2 and Db2 during the next discovery period.

When the switching timings of the control signals SA2 and SB2 are changed randomly, the control unit 108 randomly selects arbitrary delay times Dai and Dbi from among the held delay times during an arbitrary discovery period, and randomly selects other delay times Daj and Dbj (j≠i) during the next discovery period.

[Effect of the Burst Receiver Circuit]

As described above, according to the burst receiver circuit 20 of the present embodiment, when the control unit 108 sets the switching timings of the receive function (specifically, the operating mode of the pre-amplifier 102 and the time constant of the time constant circuit 105) for the synchronization section by adding delay times Dai and Dbi to a time point td0 to td2 at which a burst signal is detected by the signal detector circuit 116, the control unit 108 changes the timings of the switching timings by adopting different sets of delay times Dai and Dbi in fixed order or randomly.

Hence, even if the burst signal arrival time point td0 to td2 moves forward or backward, by adding a different set of delay times Dai and Dbi, the switching timings of the control signals SA2 and SB2 can be set at appropriate time points within the synchronization section.

Accordingly, by making a change to the receive function using a plurality of sets of delay times Dai and Dbi a plurality of times, the receive function can be changed at appropriate timings. Thus, the optical line terminal 1 can appropriately receive even a burst signal that is transmitted during a discovery period from an optical network unit that cannot set a long synchronization section.

[First Variant]

Although in the above-described embodiment the delay times Dai and Dbi are changed in fixed or random order, a determination as to whether to change the delay times Dai and Dbi may be made according to whether a burst signal has been able to be appropriately received.

Specifically, a clock and data recovery circuit (CDR circuit) is normally provided subsequent to the burst receiver circuit 20.

Hence, a signal indicating as to whether clock and data recovery has succeeded is inputted to the control unit 108. Then, when the control unit 108 obtains a recovery success signal from the clock and data recovery circuit within a predetermined period of time after a burst detection signal SD of the signal detector circuit 116 rises, the control unit 108 does not change the delay times Dai and Dbi.

On the other hand, when the control unit 108 does not obtain the above-described recovery success signal within the predetermined period of time after the burst detection signal SD of the signal detector circuit 116 rises, the control unit 108 changes the delay times Dai and Dbi.

By doing so, compared to the case in which the values of the delay times Dai and Dbi are changed in fixed or random order, the possibility that reception of a burst signal can be appropriately received can be increased.

However, when, as in the above-described embodiment, the values of the delay times Dai and Dbi are changed in fixed or random order, there is no need to determine from a signal from the clock and data recovery circuit whether the recovery has succeeded. Thus, there is an advantage in ease of control to change the delay times Dai and Dbi.

[Other Variants]

The embodiment (including the above-described variant) disclosed herein is in all respects as illustrative and not restrictive. The scope of right of the present invention includes all changes which come within the range of equivalency of the configurations recited in the claims, but not the above-described embodiment.

For example, although in the above-described embodiment the control unit 108 controls the switching timings of both of the operating mode of the pre-amplifier 102 and the time constant of the time constant circuit 105, the configuration may be such that the control unit 108 controls only one of them.

In addition, in the above-described embodiment, the receive function whose switching timings are to be controlled by the control unit 108 are not limited to the operating mode of the pre-amplifier 102 and the time constant of the time constant circuit 105.

REFERENCE SIGNS LIST

1 OPTICAL LINE TERMINAL
2 to 4 OPTICAL NETWORK UNIT

20: BURST RECEIVER CIRCUIT (RECEIVING APPARATUS)
102: PRE-AMPLIFIER (AMPLIFYING UNIT)
104: COMPARATOR
105: TIME CONSTANT CIRCUIT
108: CONTROL UNIT
113: POST-AMPLIFIER (AMPLIFYING UNIT)
114: AMPLIFIER
115: AMPLIFIER
116: SIGNAL DETECTOR CIRCUIT (DETECTING UNIT)

The invention claimed is:

1. A burst signal receiving apparatus that receives burst signals, each including a synchronization section and a data section following the synchronization section, from a plurality of sources in a time division manner, the apparatus comprising:
    an amplifying unit that amplifies each of the burst signals;
    a detecting unit that detects arrival of the burst signal from an output signal from the amplifying unit;
    a comparing unit that compares the output signal from the amplifying unit with a predetermined threshold value and outputs a binary signal; and
    a control unit that sets a timing of changing a receive function during the synchronization section by adding a delay time to a detection time point where the detecting unit performs an output, and that holds the delay times of at least two types that are a long type and a short type.

2. The burst signal receiving apparatus according to claim 1, wherein, when clock and data recovery based on the binary signal cannot be performed despite a fact that the detecting unit has detected arrival of the burst signal, the control unit changes the delay time to a different value.

3. The burst signal receiving apparatus according to claim 1, wherein the control unit changes a value of the delay time in fixed or random order every time the detecting unit detects arrival of a burst signal.

4. The burst signal receiving apparatus according to claim 1, further comprising a time constant circuit that can follow the output signal from the amplifying unit at different time constants, wherein
    the time constant is included in the receive function to be changed during the synchronization section.

5. The burst signal receiving apparatus according to claim 1, wherein
    the amplifying unit includes an amplifier circuit having, as a switchable operating mode, an adjustment mode where a gain is adjusted according to a strength of the burst signal, and a fixed mode where the gain is fixed, and
    the operating mode is included in the receive function to be changed during the synchronization section.

6. A burst signal receiving method for a case of receiving burst signals, each including a synchronization section and a data section following the synchronization section, from a plurality of sources in a time division manner, the method comprising the steps of:
    detecting arrival of each of the burst signals from an amplified signal of the burst signal;
    comparing the amplified signal with a predetermined threshold value and outputting a binary signal;
    setting a first timing of changing a receive function during the synchronization section by adding a first delay time to a detection time point of the arrival; and
    setting a second timing of changing the receive function during the synchronization section by adding a second delay time to the detection time point, the second delay time being different than the first delay time.

7. A PON optical line terminal that forms a PON system with a plurality of optical network units and performs multiple access control of upstream optical signals transmitted from the optical network units in a time division manner, the optical line terminal comprising:
    a light receiving element that receives an upstream optical signal transmitted from each of the optical network units and performs photoelectric conversion on the upstream optical signal;
    an amplifying unit that amplifies a burst signal formed of an electrical signal outputted from the light receiving element;
    a detecting unit that detects arrival of the burst signal from an output signal from the amplifying unit;
    a comparing unit that compares the output signal from the amplifying unit with a predetermined threshold value and outputs a binary signal; and
    a control unit that sets a timing of changing a receive function during the synchronization section by adding a delay time to a detection time point where the detecting unit performs an output, and that holds the delay times of at least two types that are a long type and a short type.

8. The PON optical line terminal according to claim 7, wherein the control unit re-sets the timing for a discovery period for registering the optical network units.

9. A PON system comprising:
    a plurality of optical network units; and
    the optical line terminal according to claim 7.

* * * * *